United States Patent
Houston et al.

(10) Patent No.: US 7,978,004 B2
(45) Date of Patent: Jul. 12, 2011

(54) BODY BIAS COORDINATOR, METHOD OF COORDINATING A BODY BIAS AND SUB-CIRCUIT POWER SUPPLY EMPLOYING THE SAME

(75) Inventors: Theodore W. Houston, Richardson, TX (US); Andrew Marshall, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/259,999

(22) Filed: Oct. 27, 2005

(65) Prior Publication Data

US 2007/0096794 A1 May 3, 2007

(51) Int. Cl.
*H02M 1/10* (2006.01)
(52) U.S. Cl. .................................. 327/537; 327/534
(58) Field of Classification Search .................. 327/534, 327/544, 535, 537, 433
See application file for complete search history.

(56) References Cited

U.S. PATENT DOCUMENTS

| | | | | |
|---|---|---|---|---|
| 6,111,455 A | * | 8/2000 | Eleyan et al. | 327/537 |
| 6,329,874 B1 | * | 12/2001 | Ye et al. | 327/544 |
| 6,404,269 B1 | * | 6/2002 | Voldman | 327/534 |
| 6,556,071 B2 | * | 4/2003 | Notani et al. | 327/544 |
| 2001/0013806 A1 | * | 8/2001 | Notani | 327/534 |

* cited by examiner

*Primary Examiner* — Lincoln Donovan
*Assistant Examiner* — Diana J Cheng
(74) *Attorney, Agent, or Firm* — John J. Patti; Wade J. Brady, III; Frederick J. Telecky, Jr.

(57) ABSTRACT

The present invention provides a body bias coordinator for use with a transistor employing a body region. In one embodiment, the body bias coordinator includes a control unit configured to control the transistor and make it operable to provide a virtual supply voltage from a source voltage during activation of the transistor. The body bias coordinator also includes a connection unit coupled to the control unit and configured to connect the body region to the virtual supply voltage during activation of the transistor. In an alternative embodiment, the connection unit is further configured to connect the body region to another voltage during non-activation of the transistor. These embodiments improve transistor active and passive performance, permit smaller transistor sizing and reduce leakage current.

18 Claims, 1 Drawing Sheet

US 7,978,004 B2

BODY BIAS COORDINATOR, METHOD OF COORDINATING A BODY BIAS AND SUB-CIRCUIT POWER SUPPLY EMPLOYING THE SAME

TECHNICAL FIELD OF THE INVENTION

The present invention is directed, in general, to microelectronics and, more specifically, to a body bias coordinator, method of coordinating a body bias and a sub-circuit power supply employing the coordinator or the method.

BACKGROUND OF THE INVENTION

Integrated circuit systems are rapidly increasing in device count and operating speed. Each of these attributes tends to increase power requirements directly while both together cause power requirements to increase exponentially. Therefore, dealing with power requirements associated with integrated circuit systems is becoming a much more critical design arena than before. These power requirements and their corresponding temperature effects have led to the need for additional power management considerations and techniques.

One such management technique involves separating the integrated circuits that require full power all of the time to perform their intended tasks from those that may use reduced power to perform some of their intended tasks at least some of the time. Another power management technique further isolates blocks of circuits where the power may be fully removed during certain aspects of system operation. For example, these circuit blocks may have their operating power completely removed when they become operationally inactive for a period of time. Supplying and removing power, either partially or completely, from a block of circuitry may be controlled by a header or footer transistor.

The header transistor forms a controllable switch between a positive power supply and a circuit block. Similarly, the footer transistor forms a controllable switch between a negative power supply and the circuit block. Activation of the header or footer transistor allows a virtual supply to be connected to the circuit block. Often, both header and footer transistors are employed to provide both positive and negative virtual supplies concurrently when the block of circuitry is active.

Similarly, header and footer transistors are used to reduce current to blocks of circuitry during their inactive modes of operation. There is a potential advantage in changing the header or footer transistor body voltage to raise its threshold voltage and thereby reduce its leakage when in the inactive mode. Alternatively, lowering the threshold voltage during the active mode provides a reduced transistor voltage drop for the header or footer transistor. However, there is a capacitance associated with the body nodes of the header and footer transistors, which may be relatively large. This capacitance requires a dynamic switching power associated with switching a voltage on the body node that may provide too large a penalty to be used in some applications, especially if powering the circuitry on and off is required too frequently. Additionally, a forward body bias to lower threshold voltage in the active mode gives rise to forward biased diode current that is generally undesirable.

Accordingly, what is needed in the art is an improved way to provide switchable power to a circuit block that is required on a more frequent basis and that will provide biasing for a lower threshold voltage in the active mode.

SUMMARY OF THE INVENTION

To address the above-discussed deficiencies of the prior art, the present invention provides a body bias coordinator for use with a transistor employing a body region. In one embodiment, the body bias coordinator includes a control unit configured to control the transistor and make it operable to provide a virtual supply voltage from a source voltage during activation of the transistor. The body bias coordinator also includes a connection unit coupled to the control unit and configured to connect the body region to the virtual supply voltage during activation of the transistor. In an alternative embodiment, the connection unit is further configured to connect the body region to another voltage during non-activation of the transistor. These embodiments improve transistor active and passive performance, permit smaller transistor sizing and reduce leakage current.

In another aspect, the present invention provides a method of coordinating a body bias for use with a transistor employing a body region. The method includes providing a virtual supply voltage from a source voltage during activation of the transistor and connecting the body region to the virtual supply voltage during activation of the transistor.

The present invention also provides, in yet another aspect, a sub-circuit power supply. The sub-circuit power supply includes a source voltage and a body bias coordinator, coupled to the source voltage, for use with a transistor employing a body region. The body bias coordinator has a control unit that controls the transistor and makes it operable to provide a virtual supply voltage from the source voltage during activation of the transistor. The body bias coordinator also has a connection unit that is coupled to the control unit and connects the body region to the virtual supply voltage during activation of the transistor. The sub-circuit power supply also includes a power supply bus coupled to the virtual supply voltage for use by a sub-circuit.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
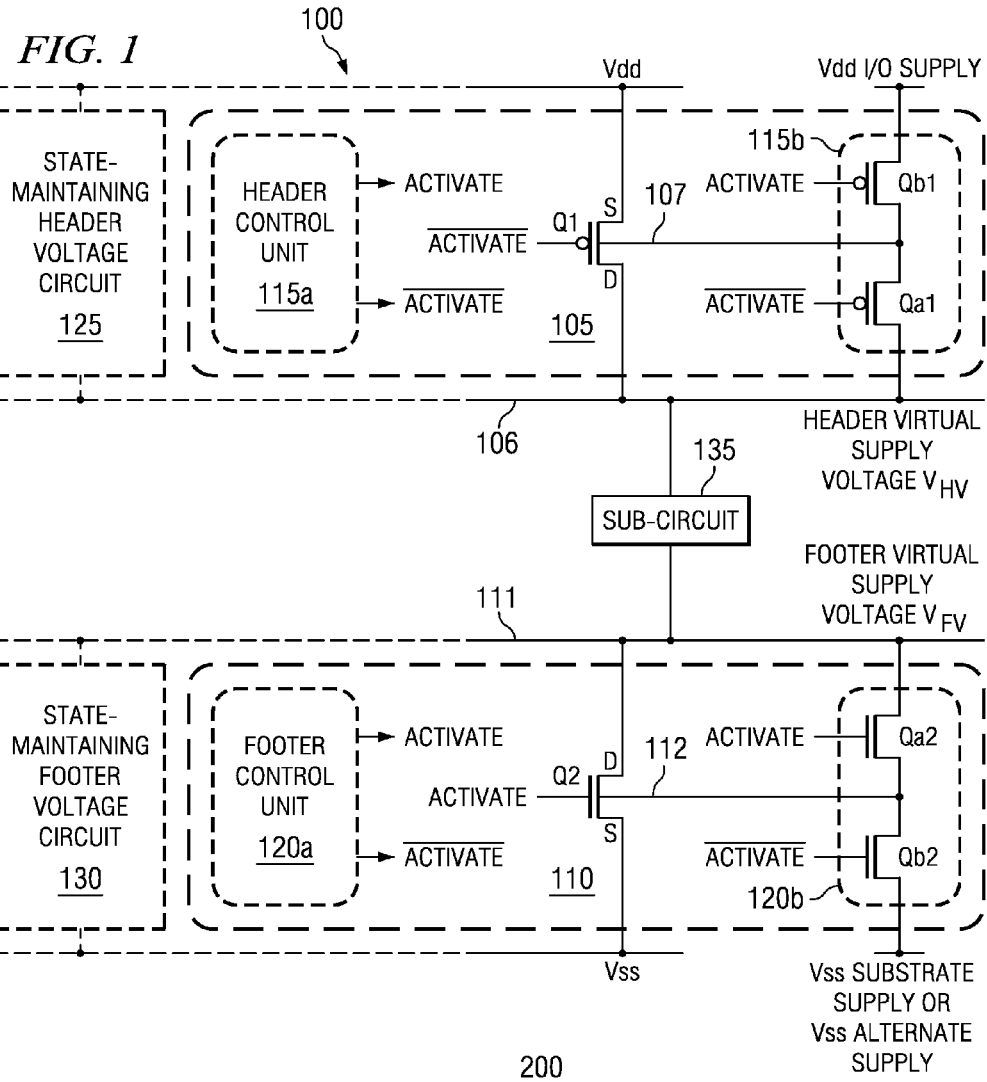
FIG. 1 illustrates a circuit diagram of an embodiment of a sub-circuit power supply constructed in accordance with the principles of the present invention.

Referring initially to FIG. 1, illustrated is a circuit diagram of an embodiment of a sub-circuit power supply, generally designated 100, constructed in accordance with the principles of the present invention. The sub-circuit power supply 100 includes a header circuit 105, a footer circuit 110 and a sub-circuit 135. The header circuit 105 includes a header transistor Q1 having a header body region 107 and a header body bias coordinator 115 having a header control unit 115a and a header connection unit 115b. The header connection unit 115b includes first and second header body region switches Qa1, Qb1. The footer circuit 110 includes a footer transistor Q2 having a footer body region 112 and a footer body bias coordinator 120 having a footer control unit 120a and a footer connection unit 120b. The footer connection unit 120b includes first and second footer body region switches Qa2, Qb2. The sub-circuit power supply 100 also includes an optional state-maintaining header voltage circuit 125 and an optional state-maintaining footer voltage circuit 130.

In the illustrated embodiment, the sub-circuit power supply 100 further includes both a header power supply bus 106 that provides a header virtual supply voltage $V_{HV}$ and a footer power supply bus 111 that provides a footer virtual supply voltage $V_{FV}$ to the sub-circuit 135. The header virtual supply voltage $V_{HV}$ is provided from a header supply voltage $V_{dd}$ when the header transistor Q1 is conducting or activated. Correspondingly, the footer virtual supply voltage $V_{FV}$ is provided from a footer supply voltage $V_{ss}$ when the footer transistor Q2 is conducting during activation. Activation of both the header and footer transistors Q1, Q2 provides a high-power operating mode for the sub-circuit 135. The high-power operating mode may be employed for conditions requiring higher frequency operations within the sub-circuit 135.

In the illustrated embodiment, the header circuit 105 employs p-channel MOSFET transistors and the footer circuit 110 employs n-channel MOSFET transistors. The first header and footer body region switches Qa1, Qa2 are respectively coupled between the header and footer body regions 107, 112 and the header and footer power supply busses 106, 111. When activated, the first header and footer body region switches Qa1, Qa2 apply a forward body bias to the header and footer transistors Q1, Q2 to lower their threshold voltages. Additionally, they respectively apply any header and footer body region charge that has accumulated during non-activation of the header and footer transistors Q1, Q2 to the header and footer power supply busses 106, 111 thereby supplementing turn-on currents, as well.

Generally, when the body regions 107, 112 are connected to the drains of the header and footer transistors Q1, Q2, as provided by the actions above, it forward-biases the source junctions so that a junction current or junction leakage is obtained, which would normally not be desirable. However, for our case, it may be recognized that this current originates from the respective drains and flows in parallel with the normal conduction current of the header and footer transistors Q1, Q2 according to the principles of the present invention.

When the header and footer transistors Q1, Q2 are not activated (i.e., in their OFF state), the body regions are disconnected from the drains thereby eliminating the additional drain to body current that was afforded during their conducting or ON state. The second header and footer body region switches Qb1, Qb2 provide separate header and footer body region biases to give a relatively high threshold voltage for the header and footer transistors Q1, Q2 when in their non-activated or OFF state. This action results in a charge being placed on each of their respective body regions. These respective charges are then employed as discussed earlier in activation of the header and footer transistors Q1, Q2.

Additionally, raising the body voltage of the header transistor Q1, when not conducting, to a higher voltage than the header supply voltage $V_{dd}$ (such as a $V_{dd}$ input/output supply voltage shown in FIG. 1) raises the threshold voltage of the header transistor Q1 and thereby reduces its transistor leakage current. If a bulk material is used for the embodiment of FIG. 1, the body voltage of the footer transistor Q2, when not conducting, is tied to a $V_{SS}$ substrate supply. Alternatively, for SOI material with body bias (e.g., PDSOI) or with a bulk process employing an isolatable P-well (i.e., containing an N buried layer and deep N-well), the body voltage of the footer transistor Q2, when not conducting, is tied to a $V_{SS}$ alternate supply, in the embodiment of FIG. 1.

The $V_{SS}$ substrate supply and the $V_{SS}$ alternate supply are usually the same potential as the footer supply voltage $V_{SS}$. Therefore, a benefit still exists when employing a body bias for the footer transistor Q2 that is neither negative nor positive with respect to the footer supply voltage $V_{SS}$. This is also true for the non-conducting header transistor Q1 when the body bias is connected to the header supply voltage $V_{dd}$. Each of these conditions reduces current and corresponding wasted power to the sub-circuit 135 when its activating power is fully removed.

Other embodiments of the present invention may employ different values of the header and footer supply voltages $V_{dd}$, $V_{ss}$, or may employ only a header circuit or a footer circuit. For example, raising and lowering the header and footer supply voltages $V_{dd}$, $V_{ss}$ separately may affect transistors in the sub-circuit 135 differently due to the effect of the back bias voltages. Raising the magnitudes of the back bias voltages will generally raise the threshold voltage, but doing so will also increase junction leakage thereby providing a tradeoff. Additionally, there may be a balance where lowering one of the header and footer supply voltages $V_{dd}$, $V_{ss}$ while raising the other provides a lower overall power requirement.

In the illustrated embodiment of FIG. 1, an optional low-power operating mode is also provided by the optional state-maintaining header voltage circuit 125 and the optional state-maintaining footer voltage circuit 130, which allow state in the sub-circuit 135 to be maintained as may be required for latches or memory arrays when the header or footer transistors Q1, Q2 are not conducting during non-activation. This low-power operating mode may also be employed for conditions that allow lower frequency operation within the sub-circuit block 135. The state-maintaining header and footer voltage circuits 125, 130 may employ a diode, a diode-connected transistor, a resistor or a regulator circuit to provide reduced values or differing values of header and footer virtual supply voltages $V_{HV}$, $V_{FV}$.

In the embodiment of FIG. 1, the header and footer control units 115a, 120a provide the same activation signal or its complement for controlling the operation of the rest of the header and footer circuits 105, 110, as shown. Optionally, different signals may be used to apply different timing. For example, when the header transistor Q1 is turned OFF and the header virtual supply voltage $V_{HV}$ is maintained by the state-maintaining header voltage circuit 125, it is not essential to raise the threshold voltage of the header transistor Q1. Thus, the second header body region switch Qb1 may remain non-activated and the first header body switch Qa1 optionally left ON or OFF when the header transistor Q1 is turned OFF, while the header virtual supply voltage $V_{HV}$ is maintained at a reduced value. The second header body region switch Qb1 may be turned ON when transitioning to a full power-off for the sub-circuit 135. If the system does not use a full power-off mode, the second header body region switch Qb1 may be omitted. Of course, the foregoing discussion may be analogously applied to the footer circuit 110, as well.

Figure 2:
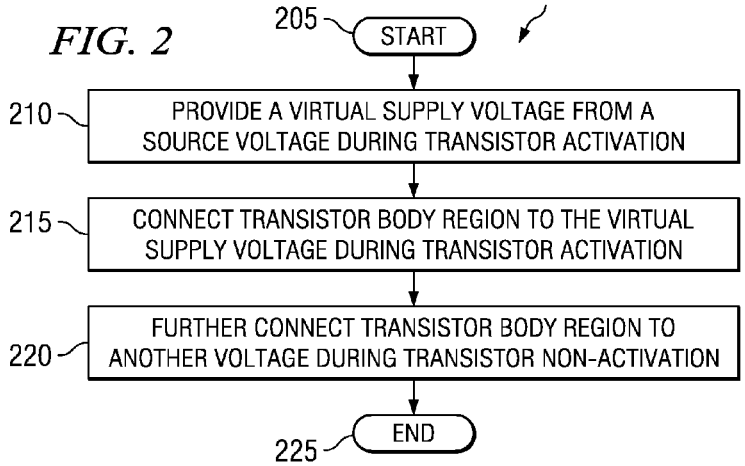
FIG. 2 illustrates a flow diagram of an embodiment of a method of coordinating a body bias carried out in accordance with the principles of the present invention.

Turning now to FIG. 2, illustrated is a flow diagram of an embodiment of a method of coordinating a body bias, generally designated 200, carried out in accordance with the principles of the present invention. The method 200 is for use with a transistor employing a body region and starts in a step 205. Then, a virtual supply voltage is provided from a source voltage during activation of the transistor, in a step 210.

In one embodiment of the present invention, the transistor is a MOSFET and the source voltage is a supply voltage for the transistor. Additionally, the source of the MOSFET is connected to the source or supply voltage and the drain of the MOSFET is connected to a bus of the virtual supply voltage during activation of the MOSFET. The virtual supply voltage may be a header virtual supply voltage or a footer virtual supply voltage as appropriate to a particular application. Then, in a step 215, the body region of the transistor is connected to the virtual supply voltage during activation of the transistor.

During non-activation of the transistor in a step 220, the body region of the transistor is connected to another voltage. In one embodiment, this voltage employs a same polarity voltage having a greater magnitude than the virtual supply voltage. That is, if the virtual supply voltage is positive, the body region of the transistor is connected to a voltage that is more positive than the virtual supply voltage, such as a positive input/output supply voltage. Correspondingly, if the virtual supply voltage is negative, the body region is connected to a voltage that is more negative, such as a negative input/output supply voltage. Alternatively, the body region may be connected to the source voltage during non-activation of the transistor. The method 200 ends in a step 225.

While the method disclosed herein has been described and shown with reference to particular steps performed in a particular order, it will be understood that these steps may be combined, subdivided, or reordered to form an equivalent method without departing from the teachings of the present invention. Accordingly, unless specifically indicated herein, the order or the grouping of the steps is not a limitation of the present invention.

In summary, embodiments of the present invention employing a body bias coordinator, a method of coordinating a body bias and a sub-circuit power supply employing the coordinator or the method have been presented. Advantages include a reduction in power required, particularly for frequent switching into and out of the fully-powered or active mode, while allowing a fast restoration of the virtual supply voltage produced by a header or footer circuit, for example. Also, there is an inherent forward body bias of the header or footer transistor when it is conducting, which allows a reduction of the voltage across it thereby providing both a lower power loss and a virtual supply voltage that more closely approximates the source or supply voltage.

Although the present invention has been described in detail, those skilled in the art should understand that they can make various changes, substitutions and alterations herein without departing from the spirit and scope of the invention in its broadest form.

What is claimed is:

1. A sub-circuit power supply circuit comprising:
    a first voltage rail that is adapted to provide a first voltage;
    a second voltage rail that is adapted to provide a second voltage;
    a third voltage rail that is adapted to provide a third voltage;
    a fourth voltage rail that is adapted to provide a fourth voltage;
    a first supply voltage output;
    a second supply voltage output;
    a footer circuit that is coupled to the third voltage rail, the fourth voltage rail, and the second supply voltage output; and
    a header circuit having:
        a transistor having a source, a drain, a gate, and body, wherein the source of the transistor is coupled to the first voltage rail, and wherein the drain of the transistor is coupled to the first supply voltage output, and wherein the gate of the transistor responsive to an activation signal so as to couple the first voltage rail to the first supply voltage output; and
        a connection unit that is coupled to the second voltage rail, the body of the transistor and the first supply voltage output, wherein the connection unit is responsive to the activation signal to couple the body of the transistor to the first supply voltage output so as to bias the body of the transistor to lower a threshold voltage of the transistor when the transistor is turned on, and to couple the body of the transistor to the second voltage rail to bias the body of the transistor to raise the threshold voltage when the transistor is turned off.

2. The circuit of claim 1, wherein the circuit further comprises a state-maintaining voltage circuit that is coupled between the first voltage rail and the first supply voltage output, wherein the state-maintaining voltage circuit is configured to provide a fifth voltage, which is different from the first voltage, to the first supply voltage output when the transistor is turned off.

3. The circuit of claim 1, wherein the transistor further comprises a first transistor, and wherein the activation signal further comprises a first activation signal, and wherein the footer circuit further comprises:
    a second transistor having a source, a drain, a gate, and a body, wherein the source of the second transistor is coupled to the third voltage rail, and wherein the drain of the second transistor is coupled to the second supply voltage output, and wherein the gate of the second transistor is responsive to a second activation signal so as couple the third voltage rail to the second supply voltage output; and
    a second connection unit that is coupled to the second voltage source, the body of the second transistor and the second supply voltage output, wherein the second connection unit is responsive to the second activation signal to couple the body of the second transistor to the second supply voltage output so as to bias the body of the second transistor to lower a threshold voltage of the second transistor when the second transistor is turned on, and to couple the body of the second transistor to the fourth voltage rail to bias the body of the second transistor to raise the threshold voltage of the second transistor when the second transistor is turned off.

4. The circuit of claim 3, wherein the header circuit further comprises: a first state-maintaining voltage circuit that is coupled between the first voltage rail and the first supply voltage, wherein the first state-maintaining voltage circuit is configured to provide a fifth voltage, which is different from the first voltage, to the first supply voltage output when the transistor is turned off, and wherein the footer circuit further comprises a second state-maintaining voltage circuit that is coupled between the third voltage rail and the second supply voltage output, wherein the second state-maintaining voltage circuit is configured to provide a sixth voltage, which is different from the third voltage, to the second supply voltage output when the second transistor is turned off.

5. The circuit of claim 4, wherein the header and footer circuits further comprise first and second control units that respectively provide the first activation signal and the second activation signal.

6. The circuit of claim 5, wherein the first activation signal and the second activation signal are the same or complementary signals.

7. The circuit of claim 1, wherein the connection unit further comprises:
   a first body region switch that is coupled between the body of the transistor and the second voltage rail, wherein the first body region switch is responsive to the activation signal so as to couple the body of the transistor to the second voltage source to bias the body of the transistor to raise the threshold voltage of the transistor when the transistor is turned off; and
   a second body region switch that is coupled between the body of the transistor and the first supply voltage output, wherein the second body region switch is responsive to the activation signal so as to couple the body of the transistor to the supply voltage output to bias the body of the transistor to lower the threshold voltage of the transistor when the first transistor is turned on.

8. The circuit of claim 7, wherein the transistor is a first p-channel MOSFET (PMOS) transistor, and wherein the first body region switch comprises a second PMOS transistor having a source and a drain coupled to the body of the transistor and the second voltage source, respectively, and having a gate coupled to receive the activation signal or its complement, and wherein the second body region switch comprises a third p-channel MOSFET transistor having a source and a drain coupled to the body of the transistor and the supply voltage output, respectively, and having a gate coupled to receive the complement of the signal applied to the gate of the second p-channel MOSFET transistor.

9. The circuit of claim 8, wherein the first voltage rail is a header power supply bus, and wherein the second voltage rail is a header input/output (I/O) supply bus, and wherein the second voltage is greater than the first voltage.

10. A sub-circuit power supply comprising:
   a header supply bus that provides a header supply bus voltage;
   a header I/O supply bus that provides a header I/O supply bus voltage, wherein the header I/O supply bus voltage is greater than the header supply bus voltage;
   a header virtual supply voltage output;
   a first footer supply bus that provides a first footer supply bus voltage;
   a second footer supply bus that provides a second footer supply bus voltage;
   a footer virtual supply voltage output;
   a header circuit including:
      a first PMOS transistor that is coupled to the header supply bus at its source, and the header virtual supply voltage output at its drain, and that receives a header activation signal at its gate, wherein the first PMOS transistor couples the header supply bus to the header virtual supply voltage output when the first PMOS transistor is on;
      a second PMOS transistor that is coupled between the body of the first PMOS transistor and the header I/O supply bus and that receives the header activation signal at its gate, wherein the second PMOS transistor couples the header I/O supply bus to bias the body of the first PMOS transistor to raise a threshold voltage of the first PMOS transistor when the first PMOS transistor is off; and
      a third PMOS transistor that is coupled between the body of the first PMOS transistor and the header virtual supply voltage output and that receives the header activation signal at its gate, wherein the third PMOS transistor couples the body of the first PMOS transistor to the header virtual supply voltage output to bias the body of the first PMOS transistor to lower the threshold voltage of the first PMOS transistor when the first PMOS transistor is on.

11. The circuit of claim 10, wherein the header circuit further comprises a state-maintaining header voltage circuit that is coupled between the header supply bus and the header virtual supply voltage output.

12. The circuit of claim 10, wherein the footer circuit further comprises:
   a first n-channel MOSFET (NMOS) transistor that is coupled to the first footer supply bus at its source, and the footer virtual supply voltage output at its, and that receives a footer activation signal at its gate, wherein the first NMOS transistor couples the first footer supply bus to the footer virtual supply voltage output when the first NMOS transistor is on;
   a second NMOS transistor that is coupled between the body of the first NMOS transistor and the second footer supply bus and that receives the footer activation signal, wherein the second NMOS transistor couples the first footer supply bus to bias the body of the first NMOS transistor to raise a threshold voltage of the first NMOS transistor when the first NMOS transistor is off; and
   a third NMOS transistor that is coupled between the body of the second NMOS transistor and the footer virtual supply voltage output and that receives the footer activation signal at its gate, wherein couples the body of the first NMOS transistor to the footer virtual supply voltage output to bias the body of the first NMOS transistor to lower the threshold voltage of the first NMOS transistor when the first NMOS transistor is on.

13. The circuit of claim 12, wherein the header circuit further comprises a state-maintaining header voltage circuit that is coupled between the header supply bus and the header virtual supply voltage output, and wherein the footer circuit further comprises a state-maintaining footer voltage circuit that is coupled between the first footer supply bus and the footer virtual supply voltage output.

14. A sub-circuit power supply including a footer circuit comprising:
   a substrate voltage supply source;
   an alternate voltage supply source;
   a footer virtual supply voltage output;
   an n-channel MOSFET footer transistor having a source coupled to the substrate voltage supply source, a drain coupled to the footer virtual supply voltage output, a gate, and a body region; the footer transistor having a threshold voltage, and being responsive to a footer activation signal applied to the gate to turn on the footer transistor and couple the substrate voltage supply source to the footer virtual supply voltage output;
   a first n-channel MOSFET transistor switch coupled between the footer transistor body region and the alternate voltage supply source; the first n-channel MOSFET transistor switch being responsive to the footer activation signal to couple the substrate voltage supply source to bias the body region to raise the threshold voltage when the footer transistor is turned off; and a second n-channel MOSFET transistor switch coupled between the footer transistor body region and the footer virtual supply voltage output; the second n-channel MOSFET transistor switch being responsive to the footer activation signal to couple the footer transistor body region to the footer virtual supply voltage output to bias the footer transistor body region to lower the threshold voltage when the footer transistor is turned on.

15. A method of providing power to a sub-circuit comprising:
  applying an activation signal to a gate of a transistor, to turn on the transistor and couple a first voltage source to an output to supply voltage to the sub-circuit;
  responsive to the activation signal, coupling a body region of the transistor to the output to bias the body region to lower a threshold voltage of the transistor when the transistor is turned on;
  responsive to the activation signal, coupling the body region of the transistor to a second voltage source to bias the body region to raise the threshold voltage when the transistor is turned off;
  applying a second activation signal to a gate of a second transistor, to turn on the second transistor and couple a third voltage source to a second output to supply voltage to the sub-circuit;
  responsive to the second activation signal, coupling a body region of the second transistor to the second output to bias the second transistor body region to lower a threshold voltage of the second transistor when the second transistor is turned on; and
  responsive to the second activation signal, coupling the body region of the second transistor to a fourth voltage source to bias the second transistor body region to raise the second transistor threshold voltage when the second transistor is turned off.

16. The method of claim 15, further comprising using a first state-maintaining voltage circuit coupled between the first voltage source and the supply voltage output to provide a voltage, different than voltage at the first voltage source, to the supply voltage output when the transistor is turned off; and using a second state-maintaining voltage circuit coupled between the third voltage source and the second supply voltage output to provide another voltage, different than voltage at the third voltage source, to the second supply voltage output when the second transistor is turned off.

17. The method of claim 16, further comprising providing the activation signal and the second activation signal, wherein the activation signal and the second activation signal are the same or complementary signals.

18. A method of providing power to a sub-circuit comprising:
  applying a header activation signal to a gate of a p-channel MOSFET (PMOS) header transistor, to turn on the header transistor and couple a header supply bus to a header virtual supply voltage output;
  responsive to the header activation signal, switching a first PMOS transistor switch to couple a body region of the header transistor to the header virtual supply voltage output to bias the body region to lower a threshold voltage of the header transistor when the header transistor is turned on;
  responsive to the header activation signal, switching a second PMOS transistor switch to couple the body region of the header transistor to a header source of higher voltage than voltage of the header supply bus to bias the body region to raise the threshold voltage when the header transistor is turned off;
  applying a footer activation signal to a gate of an n-channel MOSFET (NMOS) footer transistor, to turn on the footer transistor and couple a substrate voltage supply source to a footer virtual supply voltage output;
  responsive to the footer activation signal, switching a first NMOS transistor switch to couple a body region of the footer transistor to the footer virtual supply voltage output to bias the footer transistor body region to lower a threshold voltage of the footer transistor when the footer transistor is turned on; and
  responsive to the footer activation signal, switching a second NMOS transistor switch to couple the body region of the transistor to a an alternate voltage supply source to bias the body region to raise the threshold voltage when the footer transistor is turned off.

* * * * *